United States Patent
Ooishi

(10) Patent No.: US 6,958,928 B2
(45) Date of Patent: Oct. 25, 2005

(54) THIN FILM MAGNETIC MEMORY DEVICE WITH MEMORY CELL HAVING MAGNETIC TUNNEL JUNCTION

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 261 days.

(21) Appl. No.: 10/412,589

(22) Filed: Apr. 14, 2003

(65) Prior Publication Data

US 2004/0109348 A1  Jun. 10, 2004

(30) Foreign Application Priority Data

Dec. 5, 2002  (JP) ............... 2003-353540

(51) Int. Cl.[7] .................................. G11C 11/00
(52) U.S. Cl. ................. 365/158; 365/171; 365/173
(58) Field of Search ................. 365/158, 171, 365/173, 189.04

(56) References Cited

U.S. PATENT DOCUMENTS

| | | |
|---|---|---|
| 6,271,710 B1 | 8/2001 | Ooishi |
| 6,611,454 B2 * | 8/2003 | Hidaka ................. 365/171 |
| 6,646,911 B2 * | 11/2003 | Hidaka ................. 365/173 |
| 2003/0102901 A1 * | 6/2003 | Ooishi ................. 327/512 |

OTHER PUBLICATIONS

Takeshi Honda, et al. "MRAM-Writing Circuitry to Compensate for Thermal-Variation of Magnetization-Reversal Current" Symposium of VLSI Circuit Digest of Technical Papers (2002).

Roy Scheuerlein et al. "A 10ns Read and Write Non-Volatile Memory Array Using a Magnetic Tunnel Junction and FET Switch in Each Cell" ISSCC Digest of Technical Papers, TA7.2 (Feb. 2000) pp. 94-95, 128-129, 409-410.

* cited by examiner

*Primary Examiner*—Anh Phung
(74) *Attorney, Agent, or Firm*—McDermott Will & Emery LLP

(57) ABSTRACT

In this MRAM device, a memory block is divided into 4 regions, and 4 constant current circuits are respectively provided corresponding to the 4 regions. Bit line drivers select 2 bit lines from each of the 4 regions, that is, 8 bit lines are selected. Bit line drivers supply, to each bit line, an output current from the constant current circuit corresponding to that bit line. Accordingly, a write current flowing through a bit line can be stabilized, and stable data writing can be achieved.

10 Claims, 19 Drawing Sheets

THIN FILM MAGNETIC MEMORY DEVICE WITH MEMORY CELL HAVING MAGNETIC TUNNEL JUNCTION

BACKGROUND OF THE INVENTION

1. Field of the Invention

The present invention generally relates to a thin film magnetic memory device. More particularly, the present invention relates to a randomly accessible thin film magnetic memory device with a memory cell having a magnetic tunnel junction (MTJ).

2. Description of the Background Art

An MRAM (Magnetic Random Access Memory) device has been attracting attention as a memory device capable of non-volatile data storage at low power consumption. The MRAM device is a memory device that stores data in a non-volatile manner using a plurality of thin film magnetic elements formed on a semiconductor integrated circuit and is capable of random access to each thin film magnetic element.

In particular, it has recently been reported that a dramatic improvement in performance of an MRAM device can be achieved through the use of a tunnel magnetic resistance element utilizing a magnetic tunnel junction as a memory cell. An MRAM device with a memory cell having a magnetic tunnel junction is disclosed, for example, in "A 10 ns Read and Write Non-Volatile Memory Array Using a Magnetic Tunnel Junction and FET Switch in Each Cell," ISSCC Digest of Technical Papers, TA7.2, February 2000.

In such an MRAM device, in order to write a data signal to a tunnel magnetic resistance element, a prescribed write current needs to be passed through each of a digit line and a bit line. In the conventional MRAM device, however, a problem has arisen that the write current varied due to a variation in a power supply voltage or the like and thus stable writing of data could not be achieved.

SUMMARY OF THE INVENTION

An object of the present invention is to provide a thin film magnetic memory device that allows stable data writing.

The thin film magnetic memory device in accordance with the present invention includes a plurality of memory cells, each magnetically storing a data signal, a plurality of data write lines respectively provided corresponding to the plurality of memory cells, a constant current circuit outputting a prescribed constant current, and a write circuit selecting any of the plurality of memory cells in accordance with an address signal, supplying an output current from the constant current circuit to the data write line corresponding the selected memory cell, and writing the data signal to the memory cell. Accordingly, even when a power supply voltage varies, a stable write current can be passed through the data write line. Thus, stable data writing can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
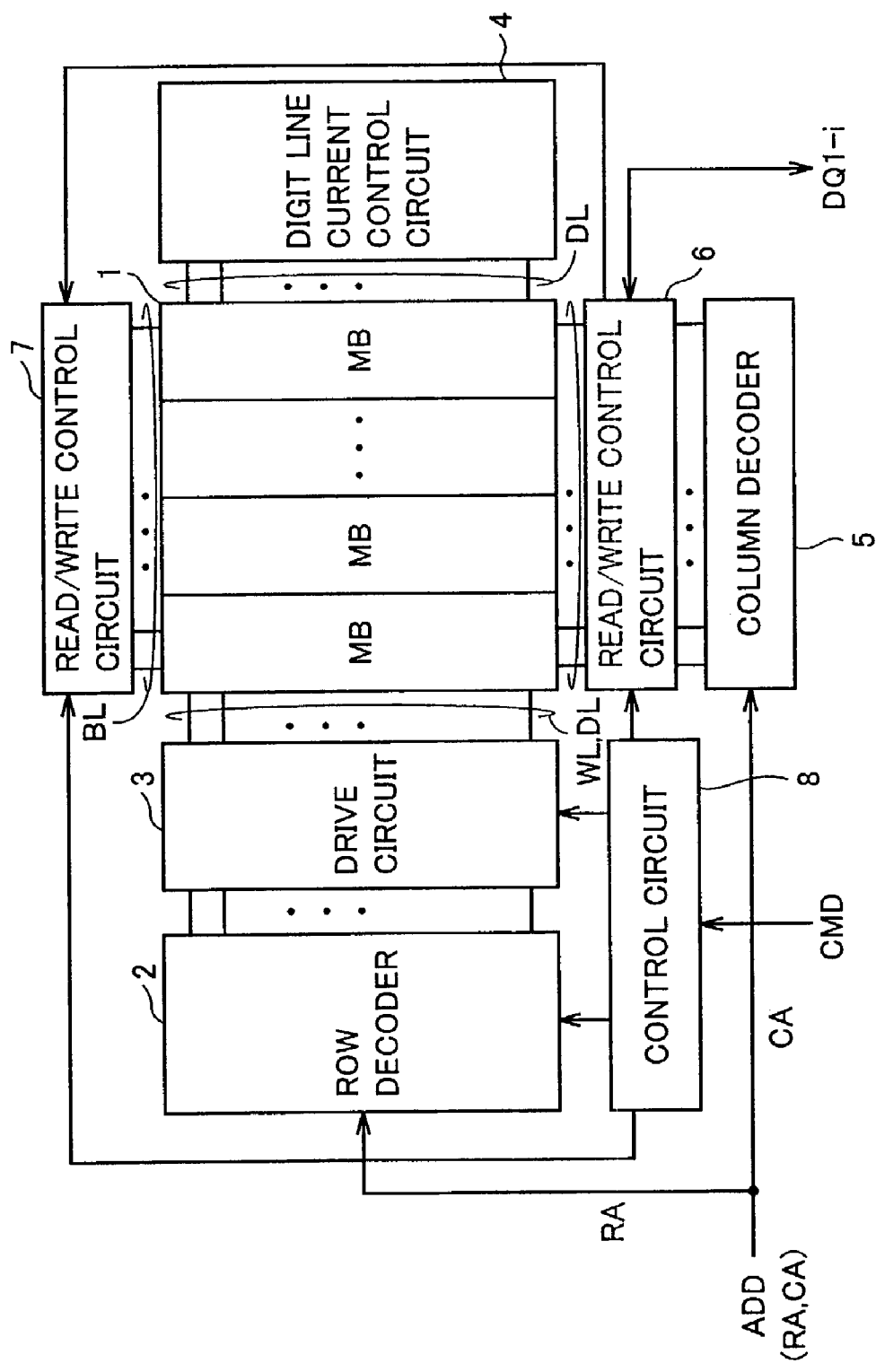
FIG. 1 is a block diagram illustrating an overall configuration of an MRAM device in accordance with one embodiment of the present invention.

FIG. 1 is a block diagram showing an overall configuration of an MRAM device in accordance with one embodiment of the present invention. In FIG. 1, the MRAM device includes a memory array 1, a row decoder 2, a drive circuit 3, a digit line current control circuit 4, a column decoder 5, read/write control circuits 6, 7, and a control circuit 8.

Figure 2:
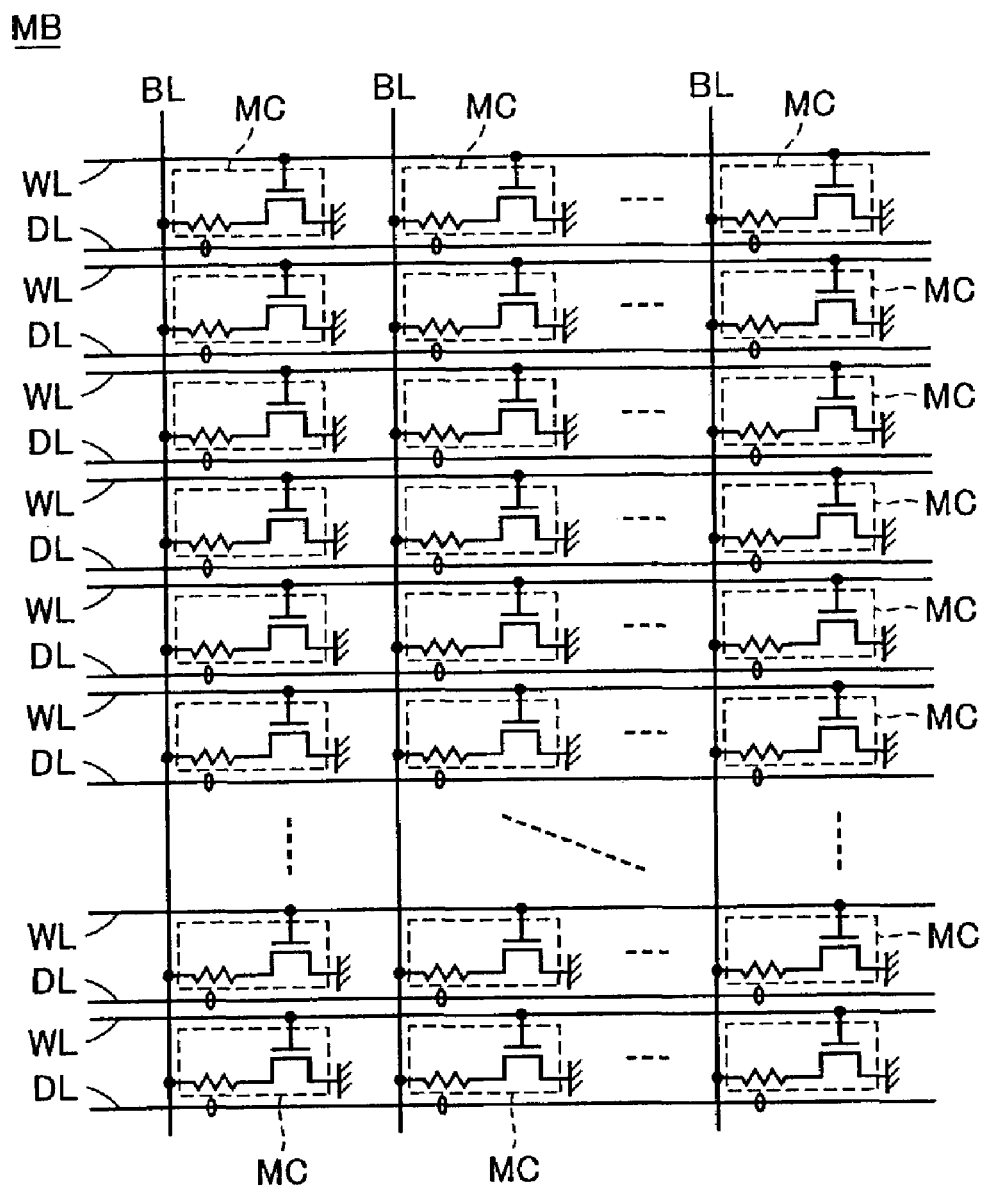
FIG. 2 is a circuit diagram illustrating a configuration of a memory block shown in FIG. 1.

Memory array 1 includes a plurality of memory blocks MBs. As shown in FIG. 2, each memory block MB includes a plurality of memory cells MCs arranged in a plurality of rows and columns, a plurality of word lines WLs respectively provided corresponding to the plurality of rows, a plurality of digit lines DLs respectively provided corresponding to the plurality of rows, and bit lines BLs respectively provided corresponding to the plurality of columns.

Figure 3:
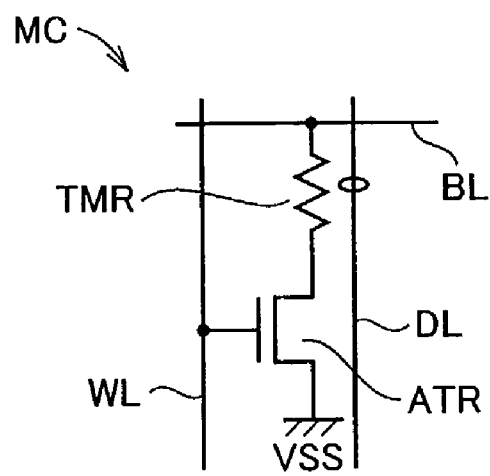
FIG. 3 is a circuit diagram illustrating a configuration of a memory cell shown in FIG. 2.

As shown in FIG. 3, each memory cell MC includes a tunnel magnetic resistance element TMR and an access transistor (an N channel MOS transistor) ATR. Tunnel magnetic resistance element TMR and access transistor ATR are serially connected between a corresponding bit line BL and a line of a ground potential VSS. The gate of access transistor ATR is connected to a corresponding word line WL. Tunnel magnetic resistance element TMR is an element of which electric resistance value varies in accordance with a logic of stored data.

Figure 4:
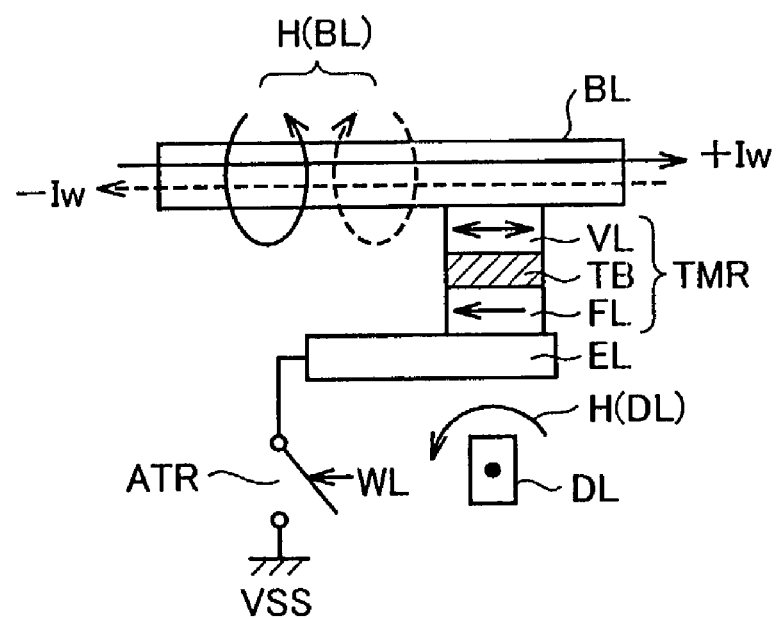
FIG. 4 illustrates a method of writing data to the memory cell shown in FIG. 3.

As shown in FIG. 4, tunnel magnetic resistance element TMR includes a fixed magnetic layer FL, a tunnel insulator film TB, and a free magnetic layer VL stacked between an electrode EL and bit line BL. Each of fixed magnetic layer FL and free magnetic layer VL is made from a ferromagnetic film. The magnetic direction of fixed magnetic layer FL is fixed to one direction. The magnetic direction of free magnetic layer VL is written to either one direction or the other direction. When fixed magnetic layer FL and free magnetic layer VL are identical in magnetic direction, the resistance value of tunnel magnetic resistance element TMR is relatively large. When the magnetic directions of fixed magnetic layer FL and free magnetic layer VL are opposite to each other, the electrical resistance value of tunnel magnetic resistance element TMR is relatively small. The 2-stage resistance values of tunnel magnetic resistance element TMR respectively correspond, for example, to data signals 1 and 0.

As shown in FIG. 4, in data writing, word line WL is pulled down to a non-selection level of "L" to render access transistor ATR non-conductive, and a write current is supplied to each of bit line BL and digit line DL. The magnetic direction of free magnetic layer VL is determined by a combination of directions of write currents flowing through bit line BL and digit line DL.

Figure 5:
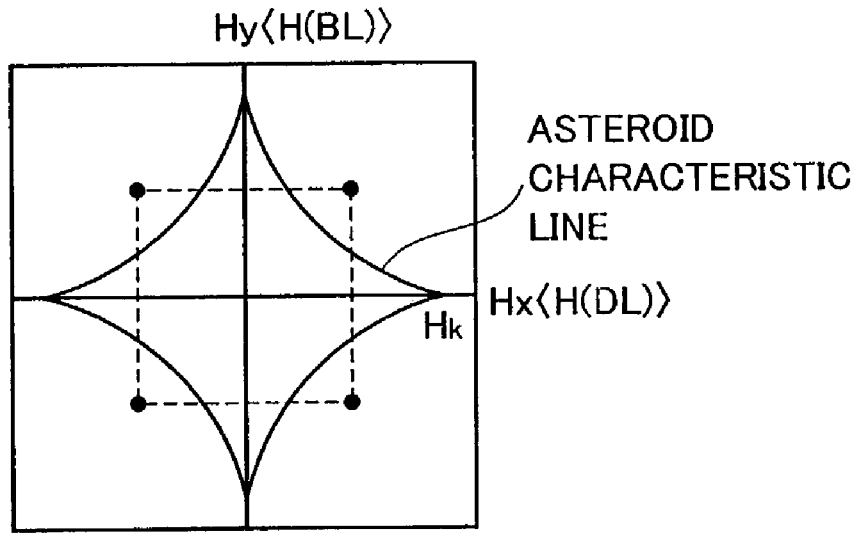
FIG. 5 is another diagram illustrating the method of writing data to the memory cell shown in FIG. 3.

FIG. 5 shows a relation between a direction of a data write current in data writing and a magnetic field direction. Referring to FIG. 5, a magnetic field Hx shown by a lateral axis denotes a magnetic field H (DL) generated by a data write current flowing through digit line DL. A magnetic field Hy shown by a vertical axis denotes a magnetic field H (BL) generated by a data write current flowing through bit line BL.

The magnetic field direction stored in free magnetic layer VL is newly written only when the sum of magnetic fields H (DL) and H (BL) reaches a region outside an asteroid characteristic line shown in the figure. In other words, the magnetic field direction stored in free magnetic layer VL is not updated when a magnetic field corresponding to a region inside the asteroid characteristic line is applied. Therefore, in order to update the data stored in tunnel magnetic resistance element TMR by a writing operation, a current must be supplied to both of digit line DL and bit line BL. The magnetic field direction, i.e. the storage data, once stored in tunnel magnetic resistance element TMR, is held in a non-volatile manner until new data is written.

Figure 6:
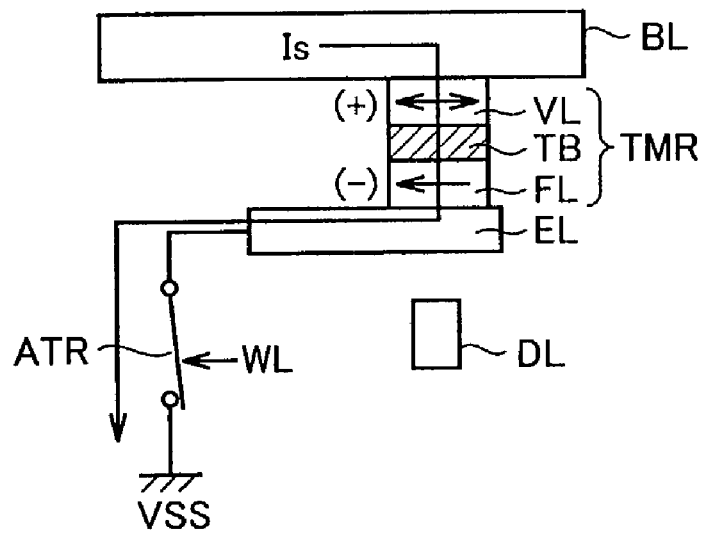
FIG. 6 illustrates a method of reading data from the memory cell shown in FIG. 3.

As shown in FIG. 6, in data reading, word line WL is raised to a selection level of "H" to render access transistor ATR conductive, and a current Is flows from bit line BL, via tunnel magnetic resistance element TMR and access transistor ATR, to the line of ground potential VSS. A value of current Is varies in accordance with the resistance value of tunnel magnetic resistance element TMR. Accordingly, through a detection of the value of current Is, data stored in tunnel magnetic resistance element TMR can be read.

Referring back to FIG. 1, row decoder 2 selects any of the plurality of rows in memory array 1 in accordance with a row address signal RA included in an address signal ADD. Drive circuit 3, in data writing, supplies a write current to digit line DL of the row selected by row decoder 2. In data reading, drive circuit 3 raises word line WL of the row selected by row decoder 2 to the selection level of "H." Digit line current control circuit 4 controls the write current in digit line DL.

Column decoder 5 selects any of the plurality of memory blocks MBs in memory array 1 in accordance with a column address signal CA included in address signal ADD. In addition, column decoder 5 selects any i columns from the plurality of columns in the selected memory block MB. In data writing, read/write control circuits 6 and 7 supply, in accordance with externally applied write data signals D1 to Di, a write current to each of i bit lines BLs corresponding to the i columns selected by column decoder 5, and write a data signal to each of i memory cells MCs. In data reading, read/write control circuits 6 and 7 detect current Is flowing through each of i bit lines BLs corresponding to the i columns selected by column decoder 5, and output data signals Q1 to Qi of a logic corresponding to a detection result. Control circuit 8 controls the overall MRAM device in accordance with an external command signal CMD.

Figure 7:
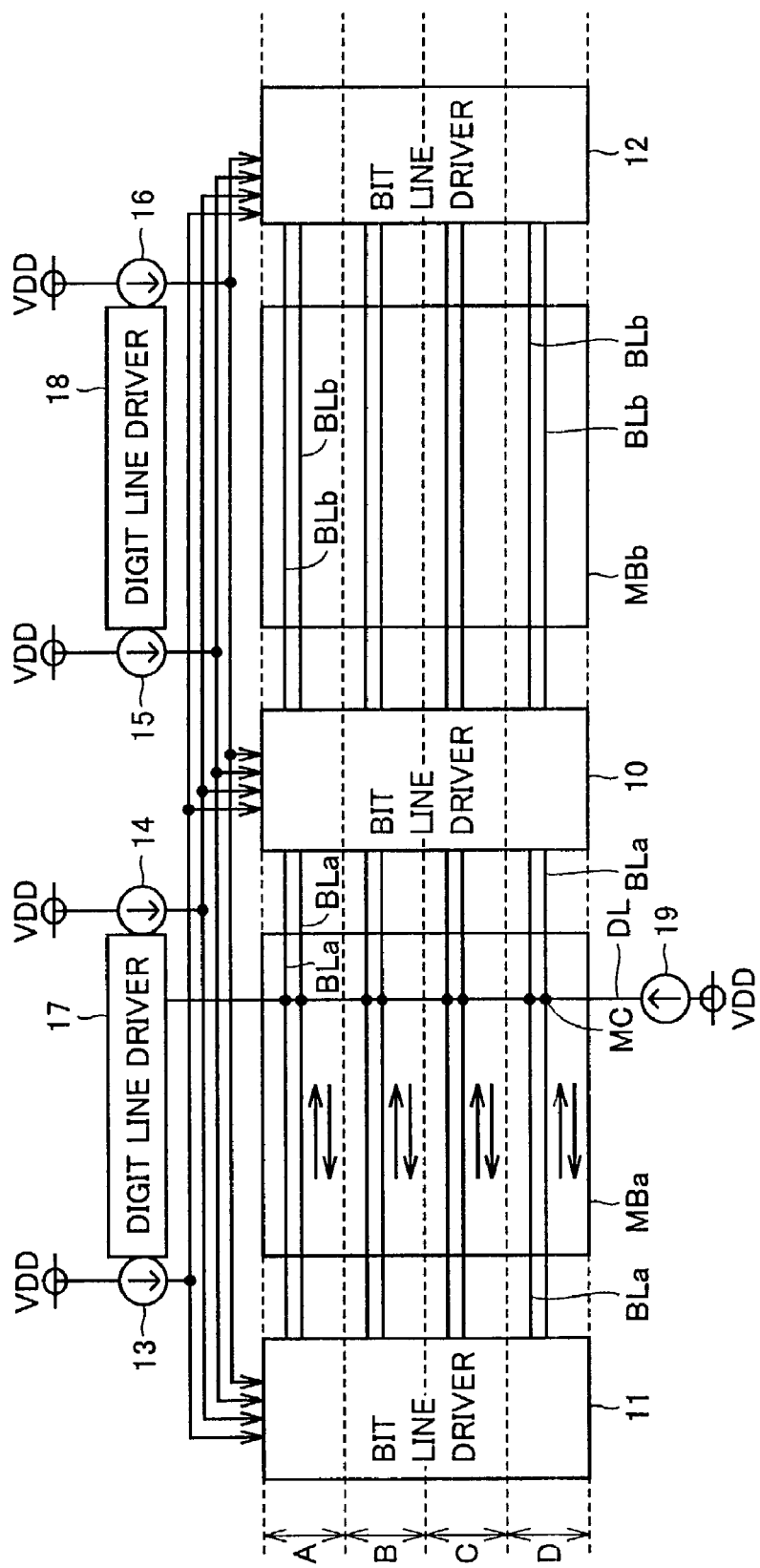
FIG. 7 is a circuit block diagram illustrating a configuration of a portion related to data writing of the MRAM device shown in FIG. 1.

In the following, a description will be given about a method of controlling a write current for bit line BL and digit line DL, which is a characteristic of the present invention. FIG. 7 is a circuit block diagram showing a portion related to data writing of one memory block MB. In FIG. 7, memory block MB is divided into 2 sub-blocks MBa and MBb in a direction in which bit line BL extends. Each bit line BL is divided into a portion BLa belonging to sub-block MBa and a portion BLb belonging to sub-block MBb. A bit line driver 10 is provided between 2 sub-blocks MBa and MBb. Bit line drivers 11 and 12 are provided at the opposite sides of 2 sub-blocks MBa and MBb.

Memory block MB is divided into 4 regions A, B, C, and D in a direction in which digit line DL extends. In data writing, any of the plurality of rows in memory block MB and any i (defined as 8 herein) columns among the plurality of columns in memory block MB are selected. Columns are grouped together in twos in advance, and 2 columns are selected in each of 4 regions A to D. The write current is supplied to each digit line DL of the selected row and to bit line BLa of each selected column in the sub-block (MBa in the figure) to which that digit line DL belongs.

Constant current circuits 13 to 16 are respectively provided corresponding to 4 regions A to D. Each of output currents from constant current circuits 13 to 16 is supplied to bit line drivers 10 to 12. The output currents from constant current circuits 13 to 16 are respectively supplied, via bit line drivers 10 to 12, to bit line BLa or BLb selected in regions A to D. Bit line drivers 10 to 12 supply write currents in directions corresponding to external data signals D1 to D8 respectively to 8 bit lines BLs selected by column decoder 5. Constant current circuits 13 to 16 and bit line drivers 10 to 12 are included in read/write control circuits 6 and 7 in FIG. 1.

Digit line drivers 17 and 18 are respectively provided corresponding to 2 sub-blocks MBa and MBb. A constant current circuit 19 is provided in common for the plurality of digit lines DLs. One end of digit line DL receives an output current from constant current circuit 19, and the other end thereof is connected to digit line driver 17 or 18. Digit line driver 17 and 18 grounds the other end of digit line DL of the row selected by row decoder 2 to supply the write current to that digit line DL. Digit line drivers 17 and 18 are included in drive circuit 3 in FIG. 1. Constant current circuit 19 is included in digit line current control circuit 4 in FIG. 1.

Figure 8:
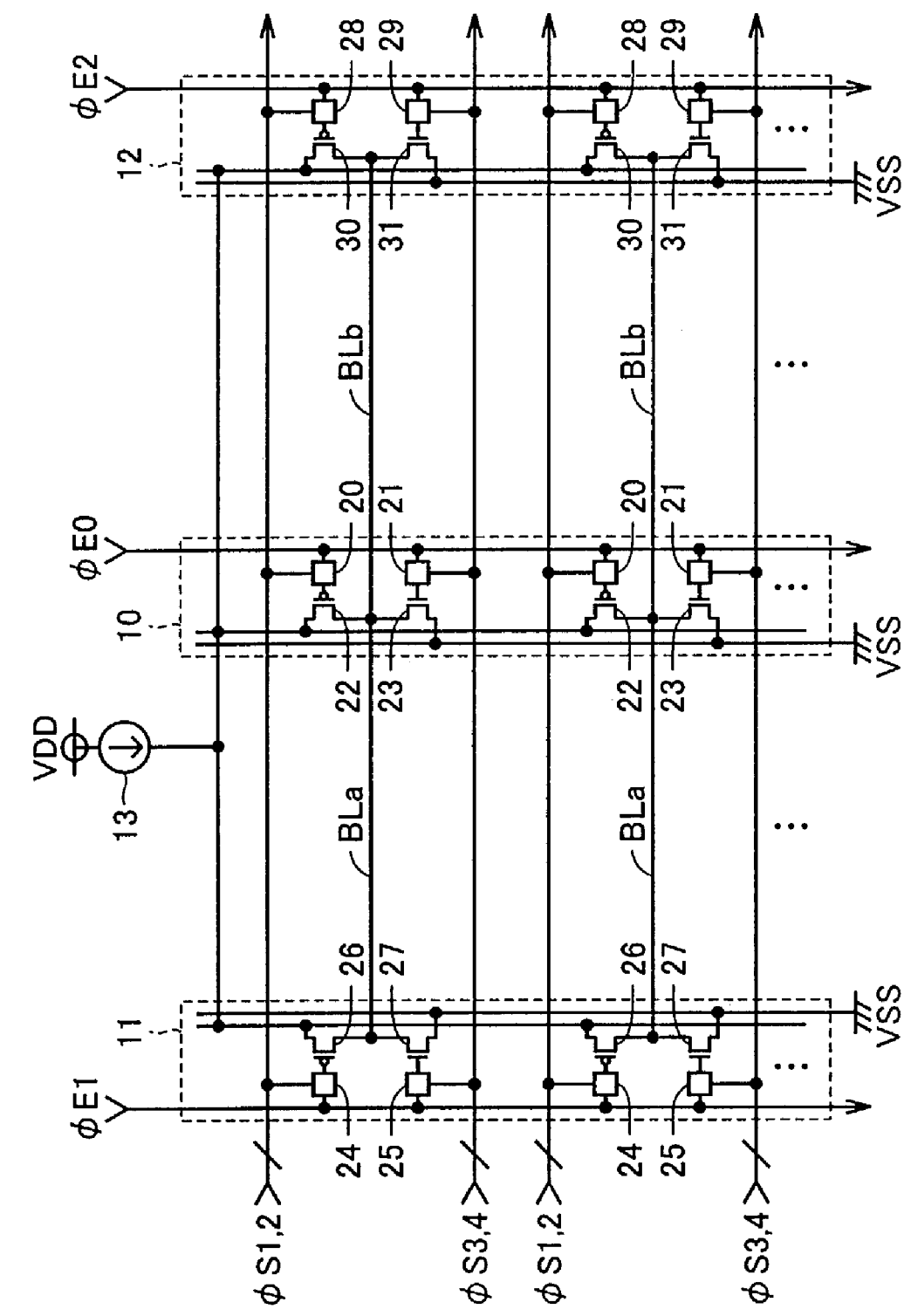
FIG. 8 is a circuit diagram illustrating a configuration of a bit line driver shown in FIG. 7.

FIG. 8 is a circuit diagram illustrating a configuration of bit line drivers 10 to 12 in region A. In FIG. 8, 4 signal lines are provided, which transmit selection signals φ S1 to φ S4 corresponding to each column. Bit line driver 10 includes logic gates 20 and 21, a P channel MOS transistor 22, and an N channel MOS transistor 23 provided corresponding to each column. Logic gate 20 outputs an active level of "L," when an activation signal φ E0 is raised to the active level of "H" and selection signals φ S1 and φ S2 for the corresponding row are both pulled down to the "L" level. Logic gate 21 outputs the active level of "H," when activation signal φ E0 is raised to the active level of "H" and both selection signals φ S3 and φ S4 for the corresponding row are raised to the "H" level. The source of P channel MOS transistor 22 is connected to an output node of constant current circuit 13, the drain thereof is connected to one ends of bit lines BLa and BLb (the center of bit line BL), and the gate thereof receives an output signal from logic gate 20. The drain of N channel MOS transistor 23 is connected to one ends of bit lines BLa and BLb, the source thereof is connected to the line of ground potential VSS, and the gate thereof receives an output signal from logic gate 21.

Bit line driver 11 includes logic gates 24 and 25, a P channel MOS transistor 26, and an N channel MOS transistor 27 provided corresponding to each column. Logic gate 24 outputs the active level of "L," when an activation signal φ E1 is raised to the active level of "H" and selection signals φ S1 and φ S2 for the corresponding column respectively attain "L" and "H" levels. Logic gate 25 outputs the active level of "H," when activation signal φ E1 is raised to the active level of "H" and selection signals φ S3 and φ S4 for the corresponding column respectively attain "H" and "L" levels. The source of P channel MOS transistor 26 is connected to an output node of constant current circuit 13, the drain thereof is connected to the other end of bit line BLa (one end of bit line BL), and the gate thereof receives an output signal from logic gate 24. The drain of N channel MOS transistor 27 is connected to the other end of bit line BLa, the source thereof is connected to the line of ground potential VSS, and the gate thereof receives an output signal from logic gate 27.

Bit line driver 12 includes logic gates 28 and 29, a P channel MOS transistor 30, and an N channel MOS transistor 31 provided corresponding to each column. Logic gate 28 outputs the active level of "L," when an activation signal φ E2 is raised to the active level of "H" and selection signals φ S1 and φ S2 for the corresponding column respectively attain "H" and "L" levels. Logic gate 29 outputs the active level of "H," when activation signal φ E2 is raised to the active level of "H" and selection signals φ S3 and φ S4 for the corresponding column respectively attain "L" and "H" levels. The source of P channel MOS transistor 30 is connected to an output node of constant current circuit 13, the drain thereof is connected to the other end of bit line BLb (the other end of bit line BL), and the gate thereof receives an output signal from logic gate 28. The drain of N channel MOS transistor 31 is connected to the other end of bit line BLb, the source thereof is connected to the line of ground potential VSS, and the gate thereof receives an output signal from logic gate 29.

For example, when a current is to flow from left to right in bit line BLa on the upper column in FIG. 8, activation signals φ E0 and φ E1 are raised to the "H" level and selection signals φ S1 to φ S4 on the upper column are respectively made to attain "L" level, "H" level, "H" level, and "H" level. This renders P channel MOS transistor 26 and N channel MOS transistor 23 on the upper column conductive. The output current from constant current circuit 13 is supplied, via P channel MOS transistor 26, bit line BLa, and N channel MOS transistor 23, to the line of ground potential VSS.

In addition, when a current is to flow from right to left in bit line BLb on the upper column in FIG. 8, activation signals φ E0 and φ E2 are raised to the "H" level and selection signals φ S1 to φ S4 on the upper column are respectively made to attain "H" level, "L" level, "H" level, and "H" level. This renders P channel MOS transistor 30 and N channel MOS transistor 23 on the upper column conductive. The output current from constant current source 13 is supplied, via P channel MOS transistor 30, bit line BLb, and N channel MOS transistor 23, to the line of ground potential VSS. In this manner, a current can flow in a desired direction in any bit lines within region A.

The configurations of bit line drivers 10 to 12 in other regions B to D are similar to that of bit line drivers 10 to 12 in region A. It is to be noted, however, that the sources of P channel MOS transistors 22, 26, and 30 in region B receive the output current from constant current circuit 14, the sources of P channel MOS transistors 22, 26, and 30 in region C receive the output current from constant current circuit 15, and the sources of P channel MOS transistors 22, 26, and 30 in region D receive the output current from constant current circuit 16.

Figure 9:
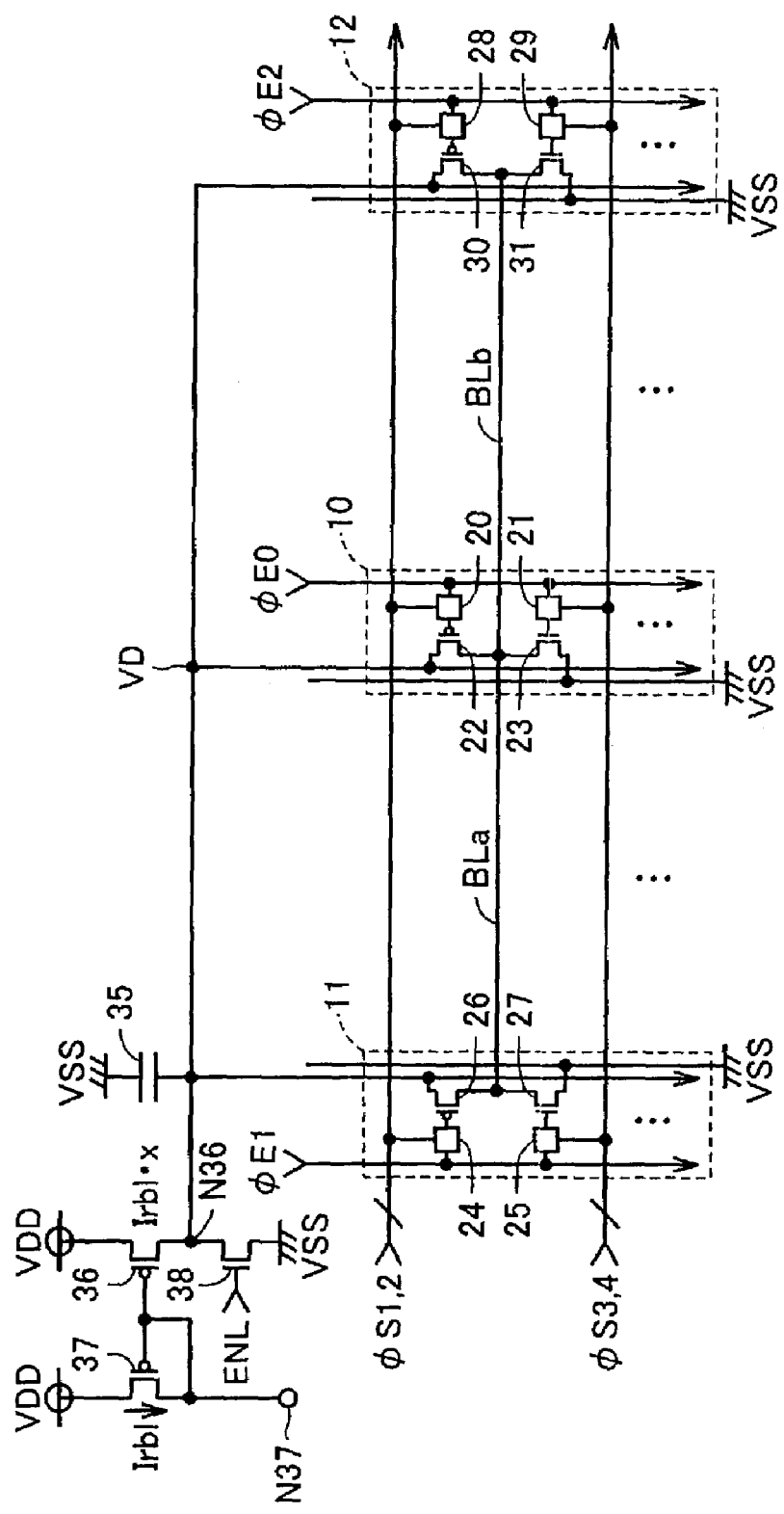
FIG. 9 is a circuit diagram illustrating a main part of a constant current circuit 13 shown in FIG. 7.

FIG. 9 is a circuit diagram illustrating a main part of constant current circuit 13. In FIG. 9, constant current circuit 13 includes a capacitor 35, P channel MOS transistors 36 and 37, and an N channel MOS transistor 38. Capacitor 35 is connected between an output node N36 of constant current circuit 13 and the line of ground potential VSS, and stabilizes a potential of node N36. P channel MOS transistors 36 and 37 are respectively connected between a line of a power supply potential VDD and nodes N36, N37, and their gates are both connected to node N37. P channel MOS transistors 36 and 37 form a current mirror circuit. The size ratio of P channel MOS transistor 36 to P channel MOS transistor 37 is set at x. A current Irbl·x, which is x times a reference current Irbl flowing through P channel MOS transistor 37, passes through P channel MOS transistor 36. The write current necessary to invert the magnetic direction of free magnetic layer VL in tunnel magnetic resistance element TMR decreases as the temperature of free magnetic layer VL becomes higher. Accordingly, reference current Irbl is controlled so as to decrease as the temperature rises. A method of controlling is described hereinafter.

N channel MOS transistor 38 is connected between output node N36 and the line of ground potential VSS, and the gate thereof receives a signal ENL. N channel MOS transistor 36 has the same current driving capability as P channel MOS transistor 38 has. Signal ENL is raised to and kept at the "H" level only for a given period of time, when activation signals φ E1 to φ E3 are raised to the "H" level. Accordingly, constant current Irbl·x flows, via N channel MOS transistor 38, to the line of ground potential VSS, and an excessive increase in a potential VBL of bit line BL is prevented.

Figure 10:
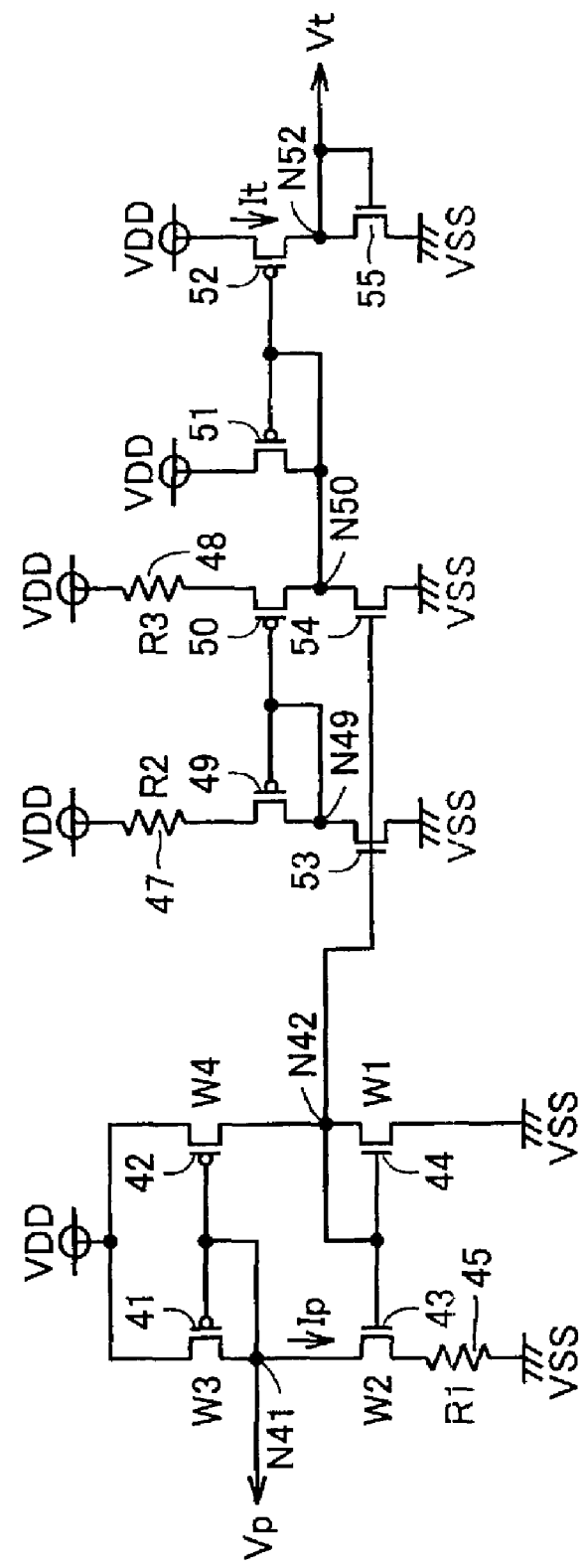
FIG. 10 is a circuit diagram illustrating a configuration of a PTAT (Proportional To Absolute Temperature) current generation circuit and a temperature dependence current generation circuit included in constant current circuit 13 shown in FIG. 7.

FIG. 10 illustrates another portion of constant current circuit 13. In FIG. 10, constant current circuit 13 further includes a PTAT current generation circuit 40 and a temperature dependence current generation circuit 46. PTAT current generation circuit 40 includes P channel MOS transistors 41 and 42, N channel MOS transistors 43 and 44, and a resistance element 45. P channel MOS transistors 41 and 42 are respectively connected between the line of power supply potential VDD and nodes N41, N42, and their gates are connected to node N41. N channel MOS transistor 43 and resistance element 45 are serially connected between node N41 and the line of ground potential VSS. N channel MOS transistor 44 is connected between node N42 and the line of ground potential VSS. The gates of N channel MOS transistors 43 and 44 are both connected to node N42. A current Ip flowing through P channel MOS transistor 41 is expressed by the following equation.

$$Ip=(kT/q)(1/R1)\ln(W2/W1)(W4/W3)$$

where k is a Boltzmann constant, T is an absolute temperature, q is electron charge, R1 is a resistance value of resistance element 45, and W1 to W4 are the gate widths of MOS transistors 44, 43, 41, and 42, respectively.

Figure 11:
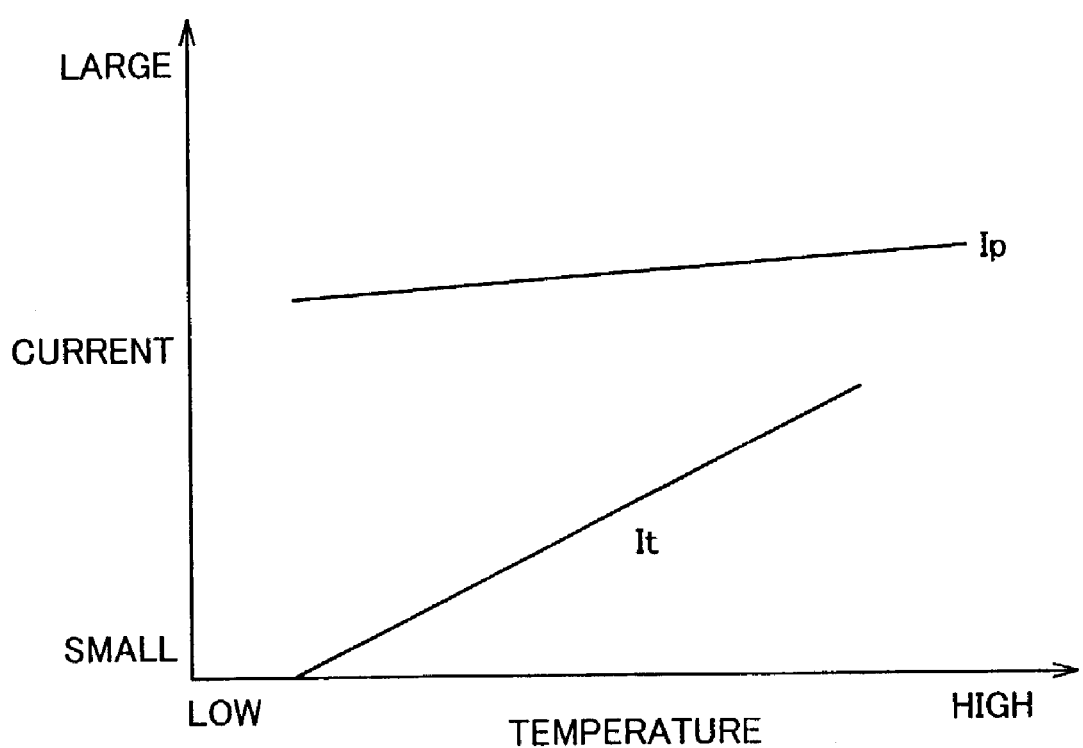
FIG. 11 illustrates an operation of the PTAT current generation circuit and the temperature dependence current generation circuit shown in FIG. 10.

Accordingly, as shown in FIG. 11, PTAT current Ip has a value proportional to absolute temperature T. In addition, the level of PTAT current Ip can be set by adjusting R1, and W1 to W4.

Referring back to FIG. 10, temperature dependence current generation circuit 46 includes resistance elements 47 and 48, P channel MOS transistors 49 to 52, and N channel MOS transistors 53 to 55. Resistance element 47 and P channel MOS transistor 49 are serially connected between the line of power supply voltage VDD and a node N49. Resistance element 48 and P channel MOS transistor 50 are serially connected between the line of power supply potential VDD and a node N50. The gates of P channel MOS transistors 49 and 50 are both connected to node N49. N channel MOS transistors 53 and 54 are respectively connected between nodes N49, N50 and the line of ground potential VSS, and their gates are both connected to node N42. P channel MOS transistors 51 and 52 are respectively connected between the line of power supply potential VDD and nodes N50, N52, and their gates are both connected to node N50. N channel MOS transistor 55 is connected between node N52 and the line of ground potential VSS, and the gate thereof is connected to node N52.

Resistance elements 47 and 48 are formed from resistance materials different from each other, and have temperature dependencies different from each other. The magnitude relation between resistance values R2 and R3 of resistance elements 47 and 48 is reversed at a certain temperature. When R2≧R3, the current flowing through a path of resistance element 47 and MOS transistors 49 and 53, and the current flowing through a path of resistance element 48 and MOS transistors 50 and 54 have the same values, and thus, It=0. When R2<R3, current It flows through P channel MOS transistor 51 so that currents flowing through N channel MOS transistors 53 and 54 have the same values. This current It flows through P channel MOS transistor 52 and N channel MOS transistor 55 as well. As shown in FIG. 11, current It is generated at a certain temperature, and increases as the temperature rises. The dependence of current It on temperature is greater than that of current Ip on temperature. The temperature at which current It is generated and the level of temperature rise can be adjusted by the resistance material and the resistance value of resistance elements 47 and 48.

Figure 12:
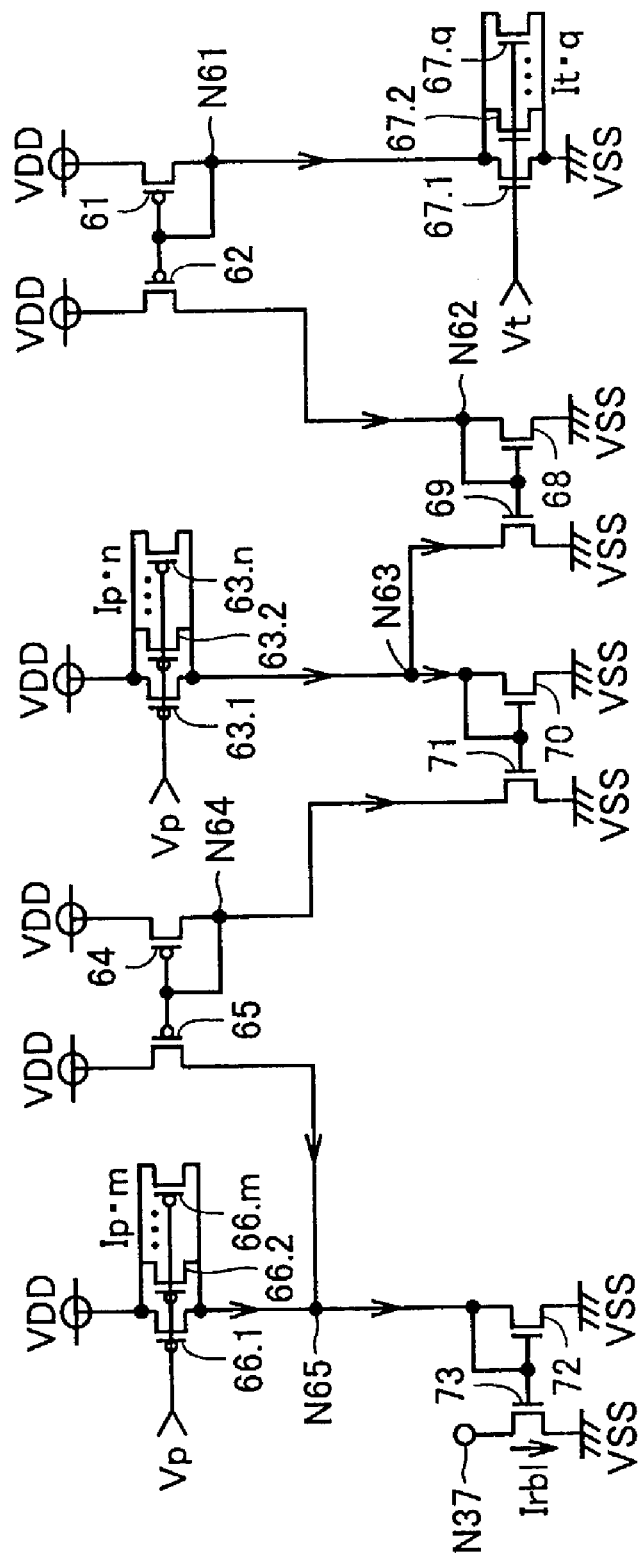
FIG. 12 is a circuit diagram illustrating a configuration of a reference current generation circuit included in constant current circuit 13 in FIG. 7.

FIG. 12 illustrates still another portion of constant current circuit 13. In FIG. 12, constant current circuit 13 includes a reference current generation circuit 60. Reference current generation circuit 60 includes P channel MOS transistors 61, 62, 63.1 to 63.n, 64, 65, 66.1 to 66.m, and N channel MOS transistors 67.1 to 67.q, and 68 to 73. It is noted that each of n, m, and q is a natural number, and that n>m. P channel MOS transistors 61 and 62 are respectively connected between the line of power supply potential VDD and nodes N61, N62, and their gates are connected to node N61. P channel MOS transistors 61 and 62 form a current mirror circuit.

N channel MOS transistors 67.1 to 67.q are connected between node N61 and the line of ground potential VSS, and receive a potential Vt of node N52 in FIG. 10 at their gates. N channel MOS transistors 68 and 69 are respectively connected between nodes N62, N63 and the line of ground potential VSS, and their gates are both connected to node N62. N channel MOS transistors 68 and 69 form a current mirror circuit. Therefore, a current It·q, which is q times temperature dependence current It, flows through each of MOS transistors 61, 62, 68, and 69.

Figure 13:
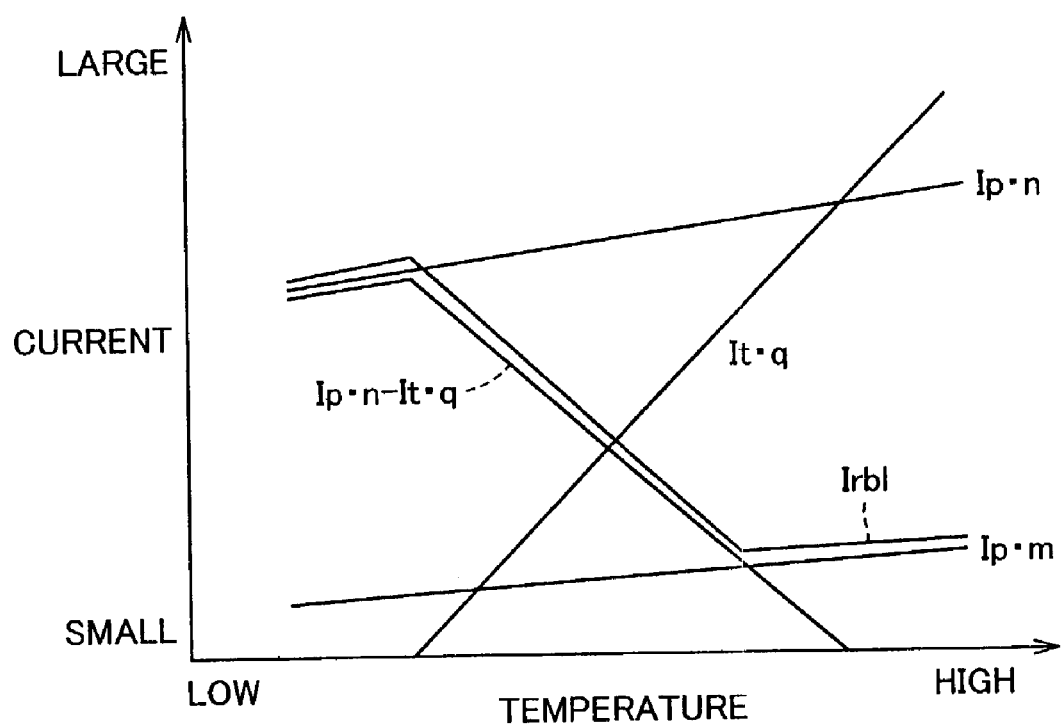
FIG. 13 illustrates an operation of the reference current generation circuit shown in FIG. 12.

P channel MOS transistors 63.1 to 63.n are connected in parallel between the line of power supply potential VDD and node N63, and their gates receive a potential Vp of node N41 in FIG. 10. N channel MOS transistors 70 and 71 are respectively connected between nodes N63, N64 and the line of ground potential VSS, and their gates are both connected to node N63. N channel MOS transistors 70 and 71 form a current mirror circuit. P channel MOS transistors 64 and 65 are respectively connected between the line of power supply potential VDD and nodes N64, N65, and their gates are both connected to node N64. P channel MOS transistors 64 and 65 form a current mirror circuit. A current Ip·n, which is n times PTAT current Ip, flows through P channel MOS transistors 63.1 to 63.n. Out of current Ip·n, It·q flows through N channel MOS transistor 69. Accordingly, a current (Ip·n–It·q) flows through each of MOS transistors 70, 71, 64, and 65. This current (Ip·n–It·q) decreases as the temperature rises, as shown in FIG. 13.

Referring back to FIG. 12, P channel MOS transistors 66.1 to 66.m are connected in parallel between the line of power supply potential VDD and node N65, and their gates both receive potential Vp of node N41 in FIG. 10. N channel MOS transistors 72 and 73 are respectively connected between nodes N65, N37 and the line of ground potential VSS, and their gates are connected to node N65. N channel MOS transistors 72 and 73 form a current mirror circuit. A current Ip·m, which is m times PTAT current Ip, flows through P channel MOS transistors 66.1 to 66.m. Thus, current Irbl flowing through each of N channel MOS transistors 72 and 73 is Ip·m+(Ip·n–It·q). Current Ip·m ensures that current Irbl does not reach a deadlock, i.e. reach 0. As shown in FIG. 13, current Irbl decreases as the temperature rises, and does not reach 0. This current Irbl flows through P channel MOS transistor 37 in FIG. 9, and the output current from constant current circuit 13 attains Irbl·x.

Figure 14:
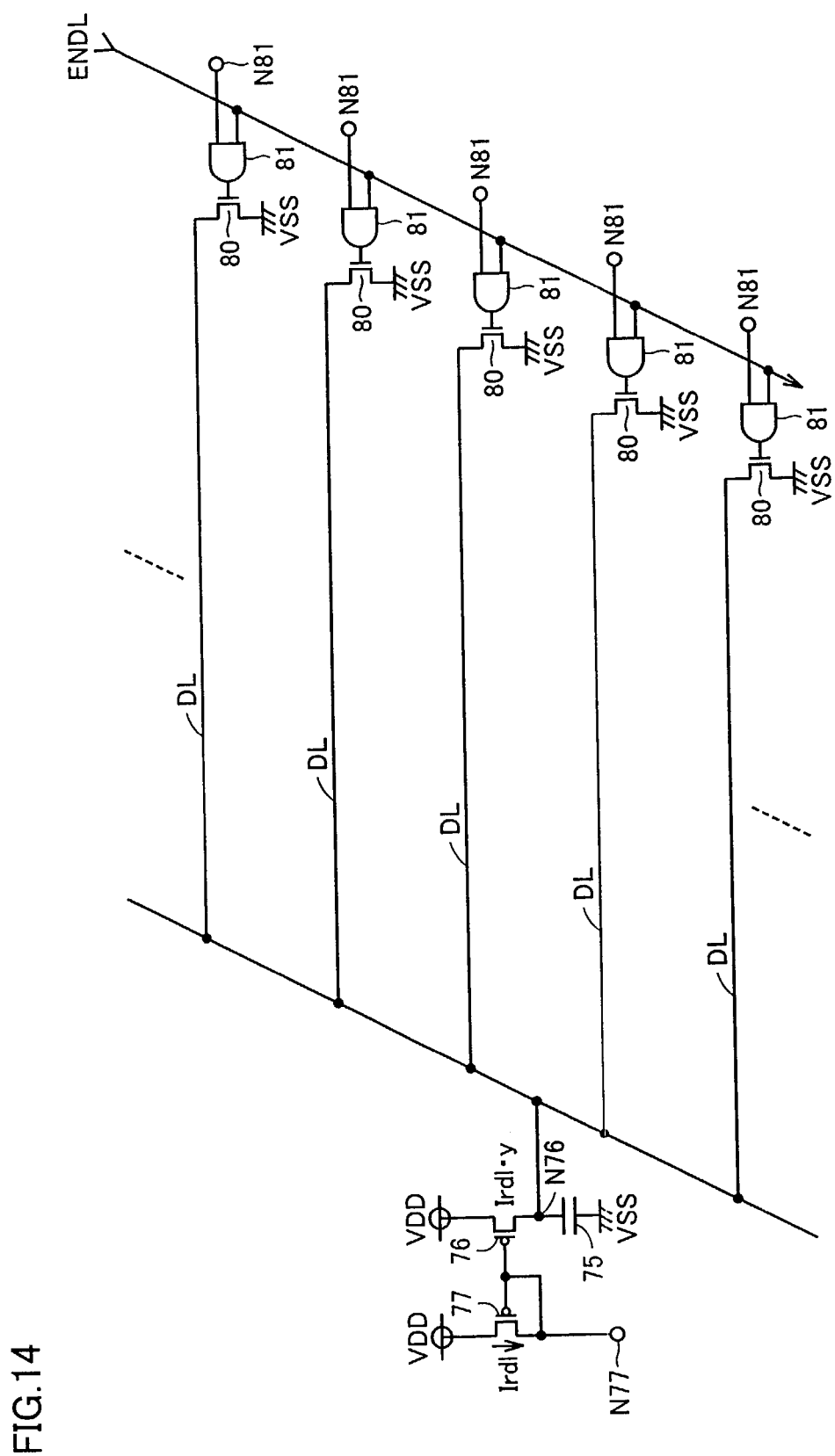
FIG. 14 is a circuit diagram illustrating a main part of a digit line driver and a constant current circuit 19 shown in FIG. 7.

FIG. 14 is a circuit diagram showing a configuration of a portion related to current control in digit line DL. Referring to FIG. 14, constant current circuit 19 in FIG. 7 includes a capacitor 75, and P channel MOS transistors 76 and 77. Capacitor 75 is connected between an output node N76 of constant current circuit 19 and the line of ground potential VSS, and stabilizes a potential of node N76. P channel MOS transistors 76 and 77 are respectively connected between the line of power supply potential VDD and nodes N76, N77, and their gates are both connected to node N77. P channel MOS transistors 76 and 77 form a current mirror circuit. The size ratio of P channel MOS transistor 76 to P channel MOS transistor 77 is set at y. A current irdl·y, which is y times a reference current Irdl flowing through P channel MOS transistor 77, flows through P channel MOS transistor 76.

Figure 15:
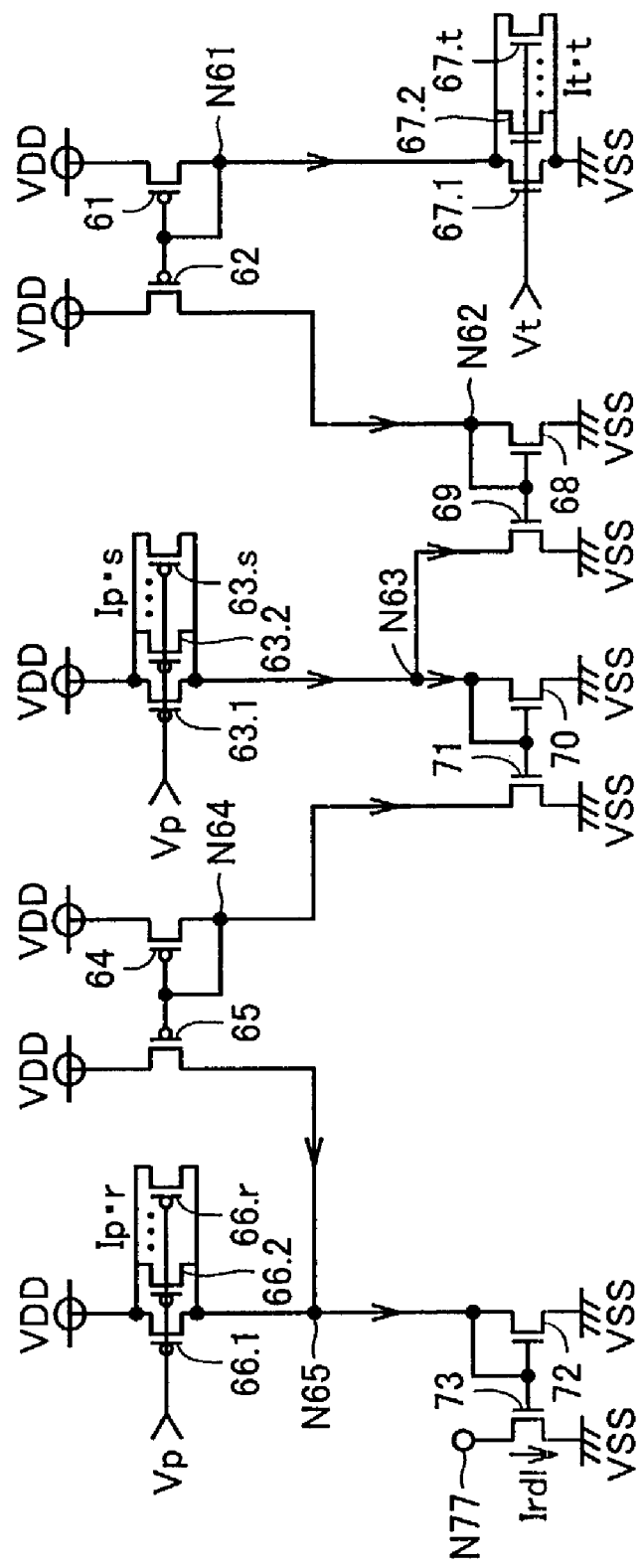
FIG. 15 is a circuit diagram illustrating a configuration of a reference current generation circuit included in constant current circuit 19 shown in FIG. 7.

Node N77 is connected to the drain of an N channel MOS transistor 73 in a reference current generation circuit 78 in FIG. 15. Reference current generation circuit 78 has the same configuration as reference current generation circuit 60 in FIG. 12 has. It is noted, however, that P channel MOS transistors 66.1 to 66.m are replaced with P channel MOS transistors 66.1 to 66.r, P channel MOS transistors 63.1 to 63.n are replaced with P channel MOS transistors 63.1 to 63.s, and N channel MOS transistors 67.1 to 67.q are replaced with N channel MOS transistors 67.1 to 67.t. Here, each of r, s, and q is a natural number. Therefore, reference current Irdl attains Ip·r+(Ip·s−It·t). Reference current Irdl decreases as the temperature rises, and does not reach 0. It is noted that PTAT current generation circuit 40 and temperature dependence current generation circuit 46 in FIG. 10 may be provided in common for constant current circuits 13 and 19, or may be provided for each of constant current circuits 13 and 19.

Referring back to FIG. 14, one ends of the plurality of digit lines DLs within memory block MB are all connected to output node N76 of constant current circuit 19. An N channel MOS transistor 80 and an AND gate 81 are provided corresponding to each digit line DL. N channel MOS transistor 80 and AND gate 81 are included in digit line drivers 17 and 18 in FIG. 7. Each N channel MOS transistor 80 is connected between the other end of the corresponding digit line DL and the line of ground potential VSS, and its gate receives an output signal from the corresponding AND gate 81. One input node of AND gate 81 receives an activation signal ENDL, and the other input node N81 is connected to row decoder 2.

In data writing, row decoder 2 selects any of the plurality of rows in accordance with row address signal RA, and raises the potential of node N81 of the selected row from the "L" level to the "H" level. When activation signal ENDL is raised to the active level of "H," an output signal of AND gate 81 of the row selected by row decoder 2 rises to the "H" level, and N channel MOS transistor 80 in that row is rendered conductive. In response, a write current from the line of power supply potential VDD flows, via P channel MOS transistor 76, digit line DL of that row, and the conductive N channel MOS transistor 80, to the line of ground potential VSS.

Figure 16:
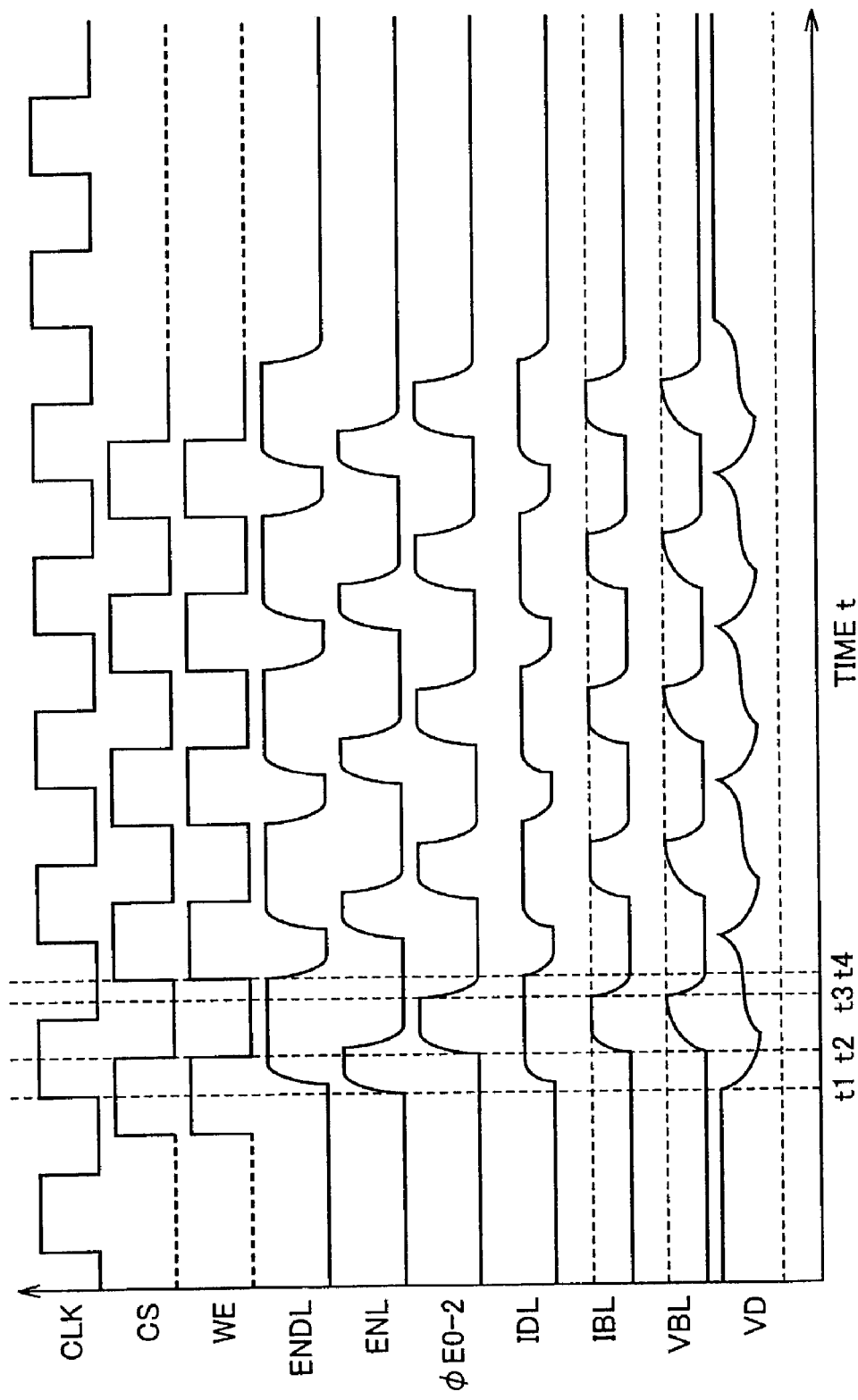
FIG. 16 is a timing chart representing a data writing operation of the MRAM device shown in FIGS. 1 to 15.

FIG. 16 is a timing chart representing a method of controlling the current in bit line BL and digit line DL shown in FIGS. 7 to 15. In FIG. 16, if signals CS and WE included in external command signal CMD are both at the "H" level at a rising edge of a clock signal CLK (at time t1), then activation signal ENDL in FIG. 14 is raised to the active level of "H," and a write current IDL flows through digit line DL of the selected row.

In addition, signal ENL in FIG. 9 is raised to the active level of "H," whereby N channel MOS transistor 38 is rendered conductive, and a potential VD of output node N36 of constant current circuit 13 decreases. Next at time t2, any two signals among activation signals φ E0 to φ E2 in FIG. 9 are raised to the active level of "H." At this point of time, signal ENL is still at the "H" level. Thus, constant current Irbl·x flowing through P channel MOS transistor 36 flows via N channel MOS transistor 38 to the line of ground potential VSS, and no current flows through bit line BL. Next, when signal ENL goes from the "H" level to the "L" level, constant current Irbl·x is divided, via bit line drivers 10 to 12, to two bit lines BLs.

When a current IBL=Irbl·x/2 flows through bit line BL, potential VBL of bit line BL increases. However, since N channel MOS transistor 38 has been rendered conductive and potential VD of output node N36 of constant current circuit 13 has been decreased in the previous time period, an excessive increase in potential VBL of bit line BL can be avoided. Next at time t3, signals φ E0 to φ E2 fall to the "L" level, and a current IBL of bit line BL is cut off. At time t4, signal ENDL falls to the "L" level, and current IDL of digit line DL is cut off.

In the present embodiment, in order to produce a write current supplied to bit line BL in data writing, constant current circuits 13 to 16 are provided. Therefore, a stable write current can be generated impervious to an influence such as a variation in power supply potential VDD. Thus, stabilized data writing can be achieved.

In addition, the output currents from constant current circuits 13 to 16 are temporarily flowed to the line of ground potential VSS before the write current is supplied to bit line BL. Accordingly, an excessive increase in potential VBL of bit line BL can be avoided. Therefore, a destruction of memory cell MC due to an application of a high voltage thereto can be prevented, and thus, an improvement in reliability can be achieved.

In order to produce a write current supplied to digit line Dl in data writing, constant current circuit 19 is provided. Therefore, a stable write current can be generated impervious to an influence such as a variation in power supply potential VDD. Thus, stabilized data writing can be achieved.

Since constant current circuit 19 is provided, a flow of a large charging current through digit line DL on power-up can be avoided. This can prevent a generation of a noise at a power supply in a system, and an improvement in system performance can be achieved.

The output currents from constant current circuits 13 to 16 and 19 decrease as the temperature rises. Accordingly, a flow of an excessively large write current can be prevented, and a reduction in current consumption and an improvement in reliability can be achieved.

The output currents from constant current circuits 13 to 16 and 19 decrease as the temperature rises, however, the currents do not reach a deadlock. Thus, reliability can be ensured. It is noted that the output currents from constant current circuits 13 to 16 and 19 may be adjusted in accordance with a parameter other than a temperature.

In the present embodiment, memory block MB is divided into 4 regions A to D, and 2 memory cells MCs are selected from each of 4 regions A to D, i.e. 8 memory cells MCs are selected. It is noted, however, that memory block MB may be divided into 2 regions and 4 memory cells MCs may be selected from each of 2 regions, or memory block MB may be divided into 8 regions and one memory cell MC may be selected from each of 8 regions. In addition, when 16 memory cells MCs are to be selected at one time, memory block MB may be divided into 16 regions and one memory cell MC may be selected from each of 16 regions, or memory block MB may be divided into 8 regions and 2 memory cells MCs may be selected from each of 8 regions, or memory block MB may be divided into 4 regions and 4 memory cells MCs may be selected from each of 4 regions, or memory block MB may be divided into 2 regions and 8 memory cells MCs may be selected from each of 2 regions. In any case, one constant current circuit is provided corresponding to one region.

In the present embodiment, the write currents are supplied to each of one digit line DL and 8 bit lines BLs to write data to 8 memory cells MCs. It is noted, however, that the write currents may be supplied to each of one bit line BL and 8 digit lines DLs to write data to 8 memory cells MCs. In this case, memory block MB is divided into 4 regions in a direction in which bit line BL extends, then 2 digit lines DLs are selected from each of 4 regions, and a constant current circuit for digit line DL may be provided corresponding to each region.

Figure 17:
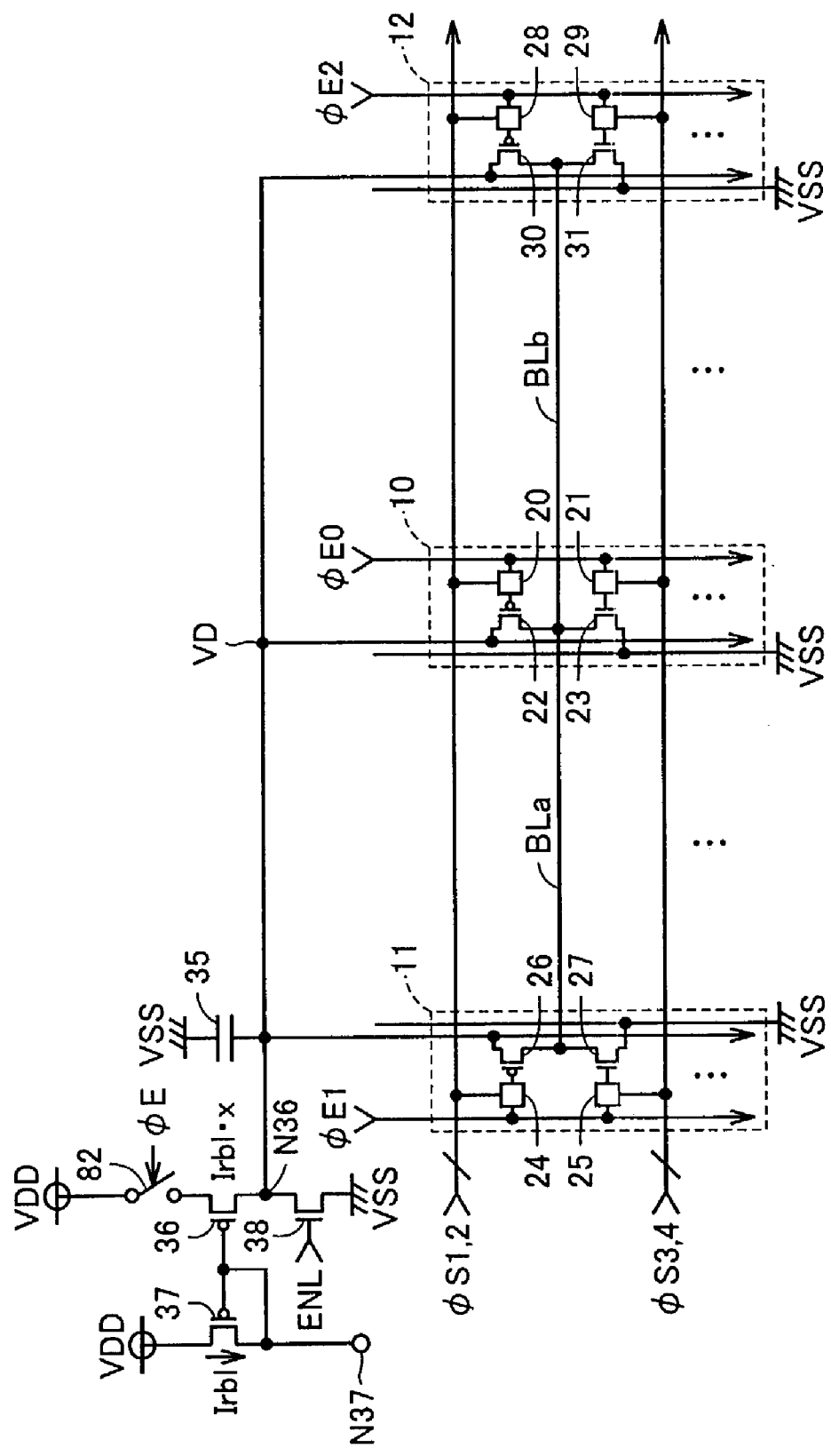
FIG. 17 is a circuit diagram showing a modification to the present embodiment.

In the present embodiment, constant current circuits 13 to 16 are normally activated. It is noted, however, that constant current circuits 13 to 16 may be activated following activation of bit line drivers 10 to 12. As shown in FIG. 17 for example, a switch 82, which is rendered conductive in response to the activation of bit line drivers 10 to 12, may be inserted between the line of power supply potential VDD and the source of P channel MOS transistor 36. For instance, an OR signal of activation signals φ E0 to φ E2 may be used as a control signal φ E for switch 82.

Figure 18:
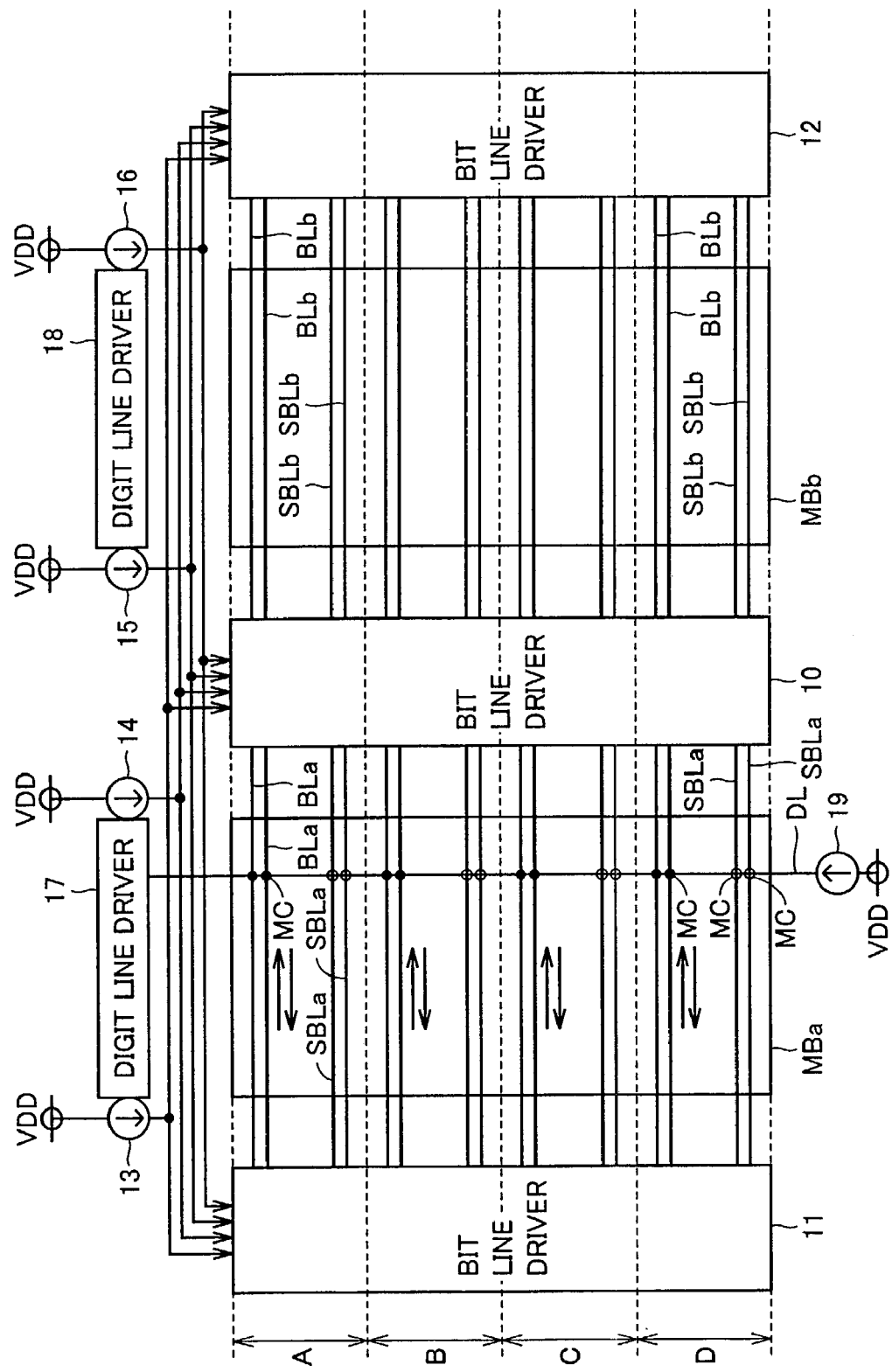
FIG. 18 is a circuit block diagram showing another modification to the present embodiment.
Figure 19:
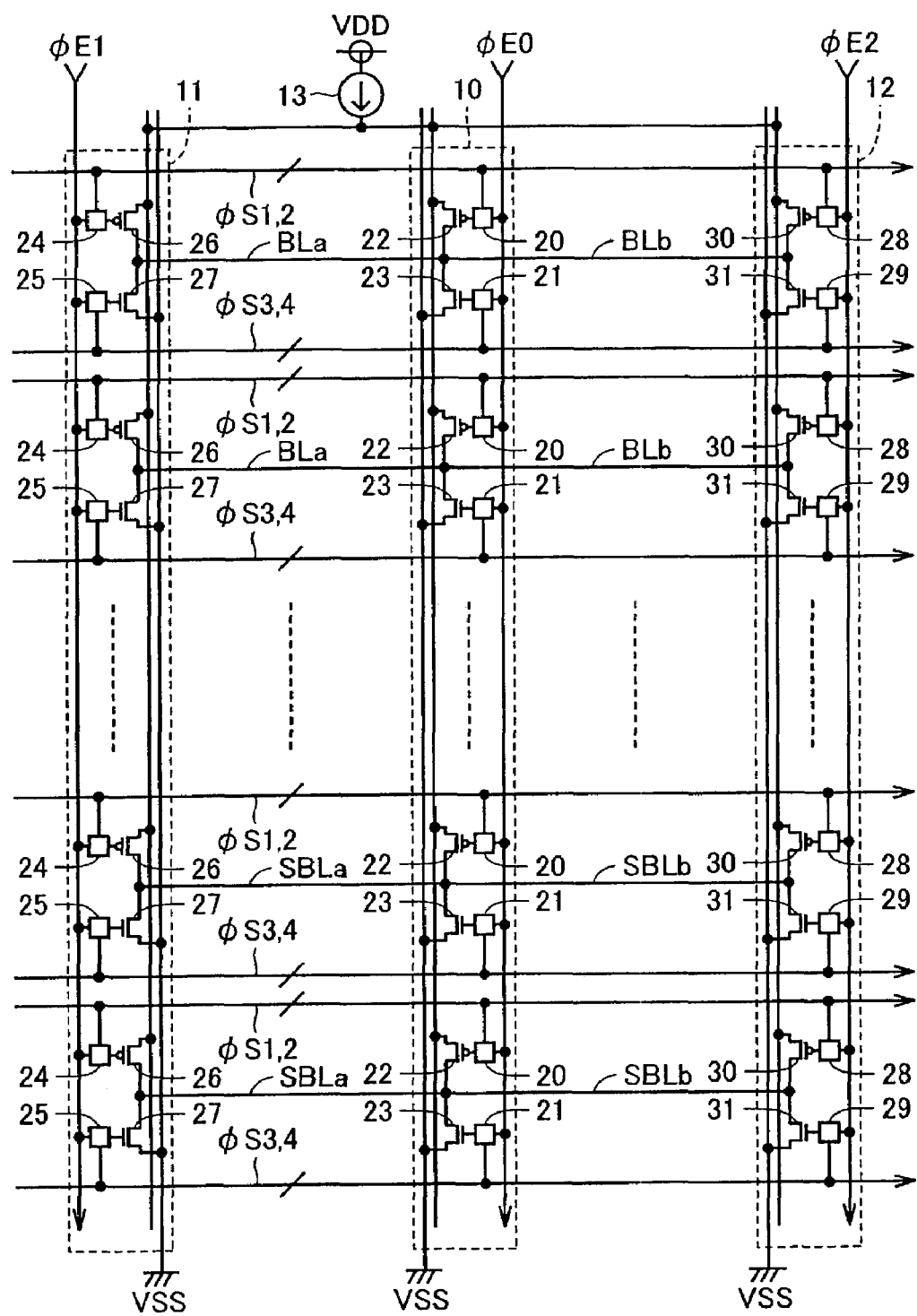
FIG. 19 is a circuit diagram illustrating a configuration of a bit line driver shown in FIG. 18.

FIG. 18 is a block diagram showing an example in which the present invention is applied to an MRAM device employing a redundancy system. In this MRAM device, 2 bit lines BLs are selected from each of 4 regions A to D, i.e. 8 bit lines BLs are selected. A set of 2 spare bit lines SBLs are provided for each of 4 regions A to D. If at least one of 2 bit lines BLs selected at one time is defective, the set of 2 bit lines BLs are replaced with the set of 2 spare bit lines SBLs in the same region. As shown in FIG. 19, the set of 2 bit lines BLs and the set of 2 spare bit lines SBLs are supplied with a write current from the same constant current circuit (13 in the figure).

Figure 20:
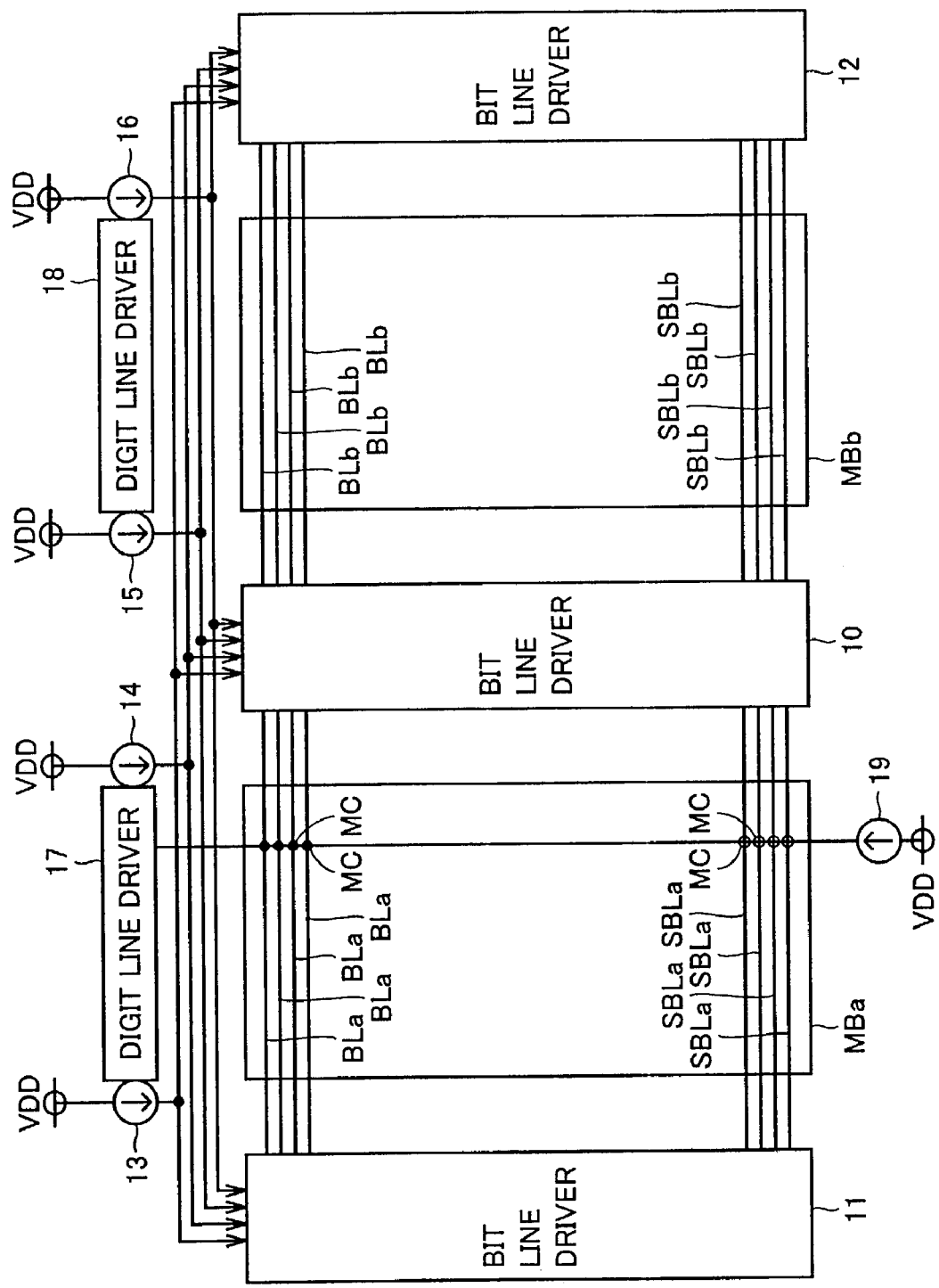
FIG. 20 is a circuit block diagram showing another modification to the present embodiment.
Figure 21:
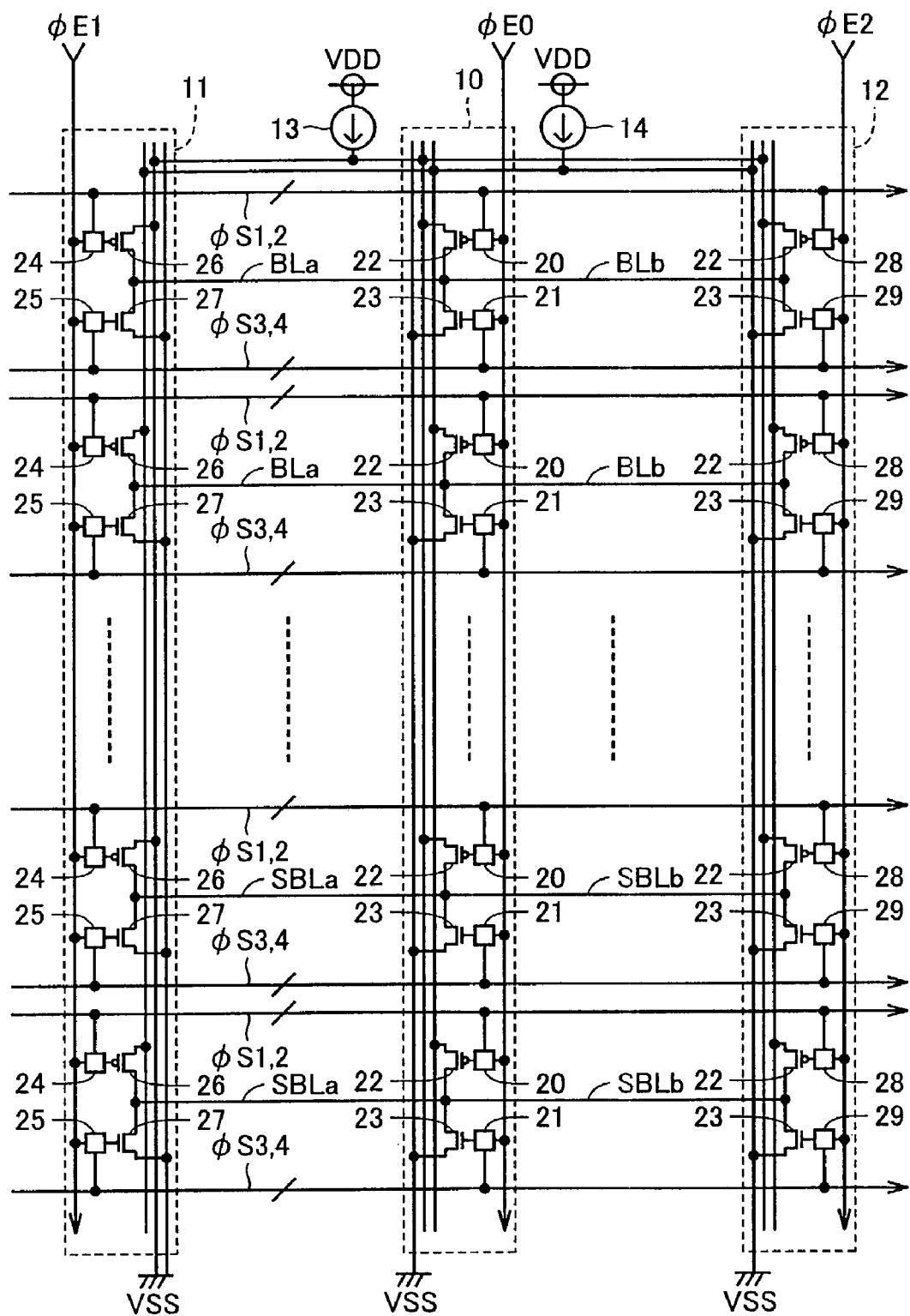
FIG. 21 is a circuit diagram illustrating a configuration of a bit line driver shown in FIG. 20.

FIG. 20 is a block diagram showing another example in which the present invention is applied to an MRAM device employing a redundancy system. In this MRAM device, a set of 4 bit lines BLs are selected at the same time. Output currents from constant current circuits 13 to 16 are respectively supplied to 4 bit lines BLs. A set of 4 spare bit lines SBLs are provided. If at least one of 4 bit lines BLs selected at one time is defective, the set of 4 bit lines BLs are replaced with the set of 4 spare bit lines SBLs. As shown in FIG. 21, one of the set of 4 bit lines BLs and spare bit line SBL corresponding to that bit line BL are supplied with a write current from the same constant current circuit (e.g. 13).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
a plurality of memory cells, each magnetically storing a data signal;
a plurality of data write lines respectively provided corresponding to said plurality of memory cells;
a constant current circuit outputting a prescribed constant current;
a write circuit selecting any of said plurality of memory cells in accordance with an address signal, supplying an output current from said constant current circuit to the data write line corresponding to the selected memory cell, and writing a data signal to the memory cell;
a spare memory cell for replacing a defective memory cell in said plurality of memory cells; and
a spare data write line provided corresponding to said spare memory cell; wherein
said write circuit selects said spare memory cell instead of said defective memory cell when said defective memory cell is designated by said address signal, and supplies the output current from said constant current circuit to said spare data write line and writes a data signal to said spare memory cell.

2. A thin film magnetic memory device, comprising:
a plurality of memory cells, each magnetically storing a data signal;
a plurality of data write lines respectively provided corresponding to said plurality of memory cells;
a constant current circuit outputting a prescribed constant current; and
a write circuit selecting any of said plurality of memory cells in accordance with an address signal, supplying an output current from said constant current circuit to the data write line corresponding to the selected memory cell, and writing a data signal to the memory cell, wherein
said plurality of memory cells are grouped together in Ns (N=an integer equal to 2 or larger) in advance, and
said write circuit selects any of a plurality of memory cell groups in accordance with said address signal, divides the output current from said constant current circuit to N data write lines corresponding to the selected memory cell group, and writes a data signal to each of N memory cells belonging to the memory cell group.

3. The thin film magnetic memory device according to claim 2, further comprising:
N spare memory cells for replacing N memory cells belonging to a defective memory cell group in said plurality of memory cell groups; and
N spare data write lines respectively provided corresponding to said N spare memory cells; wherein
said write circuit selects said N spare memory cells instead of said defective memory cell group when said defective memory cell group is designated by said address signal, divides the output current from said constant current circuit to said N spare data write lines, and writes a data signal to each of said N spare memory cells.

4. A thin film magnetic memory device, comprising:
a plurality of memory cells, each magnetically storing a data signal;
a plurality of data write lines respectively provided corresponding to said plurality of memory cells;
a constant current circuit outputting a prescribed constant current; and
a write circuit selecting any of said plurality of memory cells in accordance with an address signal, supplying an output current from said constant current circuit to the data write line corresponding to the selected memory cell, and writing a data signal to the memory cell, wherein
said plurality of memory cells are arranged in a plurality of rows and a plurality of columns, and
said plurality of data write lines include a plurality of bit lines respectively provided corresponding to said plurality of columns,
said thin film magnetic memory device further comprising a plurality of digit lines respectively provided corresponding to said plurality of rows, wherein
said write circuit includes
a digit line driver selecting any of said plurality of digit lines in accordance with a row address signal and supplying a write current to the selected digit line, and
a bit line driver selecting any of said plurality of bit lines in accordance with a column address signal and supplying the output current from said constant current circuit to the selected bit line.

5. A thin film magnetic memory device, comprising:
a plurality of memory cells, each magnetically storing a data signal;
a plurality of data write lines respectively provided corresponding to said plurality of memory cells;
a constant current circuit outputting a prescribed constant current; and
a write circuit selecting any of said plurality of memory cells in accordance with an address signal, supplying an output current from said constant current circuit to the data write line corresponding to the selected memory cell, and writing a data signal to the memory cell, wherein
said plurality of memory cells are arranged in a plurality of rows and a plurality of columns, and
said plurality of data write lines include a plurality of digit lines respectively provided corresponding to said plurality of rows,
said thin film magnetic memory device further comprising a plurality of bit lines respectively provided corresponding to said plurality of columns, wherein
said write circuit includes
a digit line driver selecting any of said plurality of digit lines in accordance with a row address signal and supplying the output current from said constant current circuit to the selected digit line, and
a bit line driver selecting any of said plurality of bit lines in accordance with a column address signal and supplying a write current to the selected bit line.

6. A thin film magnetic memory device, comprising:
a plurality of memory cells, each magnetically storing a data signal;
a plurality of data write lines respectively provided corresponding to said plurality of memory cells;
a constant current circuit outputting a prescribed constant current; and
a write circuit selecting any of said plurality of memory cells in accordance with an address signal, supplying an output current from said constant current circuit to the data write line corresponding to the selected memory cell, and writing a data signal to the memory cell, wherein
said constant current circuit includes
a first transistor connected between a line of a power supply potential and an output node, having an input electrode receiving a control voltage, and supplying said constant current, and
a second transistor connected between said output node and a line of a ground potential and rendered non-conductive upon output of said constant current.

7. The thin film magnetic memory device according to claim 6, wherein
said second transistor supplies a current at a level approximately equal to a level of said constant current upon conduction of said second transistor.

8. The thin film magnetic memory device according to claim 6, wherein
said second transistor is rendered non-conductive in response to said output node being coupled to said data write line by said write circuit.

9. A thin film magnetic memory device, comprising:
a plurality of memory cells, each magnetically storing a data signal;
a plurality of data write lines respectively provided corresponding to said plurality of memory cells;
a constant current circuit outputting a prescribed constant current; and
a write circuit selecting any of said plurality of memory cells in accordance with an address signal, supplying an output current from said constant current circuit to the data write line corresponding to the selected memory cell, and writing a data signal to the memory cell, wherein
a current necessary to be supplied to said data write line to write a data signal to said memory cell varies in accordance with a certain parameter,
said constant current circuit alters a level of said constant current in accordance with said certain parameter, and
said certain parameter includes a temperature.

10. The thin film magnetic memory device according to claim 9, wherein
said constant current circuit includes
a proportional to absolute temperature current generation circuit outputting a current proportional to an absolute temperature,
a temperature dependence current generation circuit outputting a current having a temperature dependence different from a temperature dependence of an output current from said proportional to absolute temperature current generation circuit, and
a constant current generation circuit outputting said constant current depending on the output current from said proportional to absolute temperature current generation circuit and an output current from said temperature dependence current generation circuit.

* * * * *

UNITED STATES PATENT AND TRADEMARK OFFICE
CERTIFICATE OF CORRECTION

PATENT NO. : 6,958,928 B2
DATED : October 25, 2005
INVENTOR(S) : Tsukasa Ooishi

It is certified that error appears in the above-identified patent and that said Letters Patent is hereby corrected as shown below:

<u>Title page,</u>
Item [30], Foreign Application Priority Data, change "2003-353540" to
-- 2002-353640 --.

Signed and Sealed this

Twenty-fifth Day of April, 2006

JON W. DUDAS
*Director of the United States Patent and Trademark Office*

UNITED STATES PATENT AND TRADEMARK OFFICE
CERTIFICATE OF CORRECTION

PATENT NO. : 6,958,928 B2
DATED : October 25, 2005
INVENTOR(S) : Tsukasa Ooishi

It is certified that error appears in the above-identified patent and that said Letters Patent is hereby corrected as shown below:

<u>Title page,</u>
Item [30], Foreign Application Priority Data, change "2003-353540" to -- 2002-353540 --.

Signed and Sealed this

Sixteenth Day of May, 2006

JON W. DUDAS
*Director of the United States Patent and Trademark Office*